United States Patent

Noro

Patent Number: 5,633,637
Date of Patent: May 27, 1997

[54] DIGITAL-TO-ANALOG CONVERTER CIRCUIT

[75] Inventor: Masao Noro, Hamamatsu, Japan

[73] Assignee: Yamaha Corporation, Hamamatsu, Japan

[21] Appl. No.: 353,116

[22] Filed: Dec. 9, 1994

[30] Foreign Application Priority Data

Dec. 14, 1993 [JP] Japan ................................. 5-342570

[51] Int. Cl.$^6$ ................................................. H03M 1/66
[52] U.S. Cl. ................................................. 341/144; 341/118
[58] Field of Search .................................. 341/118, 144

[56] References Cited

U.S. PATENT DOCUMENTS

| | | | |
|---|---|---|---|
| 4,267,550 | 5/1981 | Cecil | 341/154 |
| 4,496,935 | 1/1985 | Inoue et al. | 341/118 |
| 4,498,072 | 2/1985 | Moriyama | 341/118 |
| 4,810,948 | 3/1989 | Takuma | 323/280 |
| 4,891,645 | 1/1990 | Lewis et al. | 341/154 |
| 4,896,157 | 1/1990 | Mijuskovic | 341/144 |
| 5,126,740 | 6/1992 | Kawada | 341/144 |
| 5,160,930 | 11/1992 | Hosotani et al. | 341/154 |
| 5,175,548 | 12/1992 | Kawada | 341/144 |

*Primary Examiner*—Marc S. Hoff
*Attorney, Agent, or Firm*—Loeb & Loeb LLP

[57] ABSTRACT

A digital-to-analog converter circuit mainly comprises a D/A conversion part, an operational amplifier and a reference-voltage producing circuit. The D/A conversion part is configured by a resistance string, consisting of a string of resistors connected in series, and a plurality of switches which are each turned on or off response to a digital input. The reference-voltage producing circuit produces a reference voltage, the level of which is stabilized and is not affected by power-supply voltage. The operational amplifier has two inputs, wherein a noninverting input receives the reference voltage, while an inverting input is connected to a center-tap terminal of the resistance string. An output terminal of the operational amplifier is connected to a positive-power-supply terminal of the D/A conversion part. Because of the characteristic of the operational amplifier, the reference voltage is applied to the center-tap terminal of the resistance string, so that an analog output of the D/A conversion part varies up and down with respect to the reference voltage. The output of the D/A conversion part can be supplied to an amplifier circuit, which operates based on the reference voltage, through a voltage follower.

4 Claims, 2 Drawing Sheets

5,633,637

DIGITAL-TO-ANALOG CONVERTER CIRCUIT

BACKGROUND OF THE INVENTION

1. Field of the Invention

The present invention generally relates to a digital-to-analog converter circuit utilizing a resistance-string-type D/A converter.

2. Prior Art

FIG. 3 shows a circuitry including a conventional resistance-string-type D/A converter (or ladder-network DAC). A main part 21 of the D/A converter (hereinafter, simply referred to as a D/A conversion part 21) comprises a string of resistors, which are connected in series, and CMOS switches (where 'CMOS' is an abbreviation for Complementary Metal-Oxide Semiconductor). Herein, the switches are provided in parallel such that each switch is connected with a connection node at which two resistors are connected together. Power-supply voltage is applied between both edges of the resistance string. Each switch is turned on or off in response to input digital data. Hence, digital-to-analog conversion is carried out. An output of the D/A conversion part 21 is supplied to an amplifier circuit 23, containing a filter (not shown), through a voltage follower 22 made with an operational amplifier.

There is provided a center-tap terminal 24 which is located at the center of the resistance string. Hence, the output of the D/A conversion part 21 is extracted from the center-tap terminal 24 through the switch. Therefore, the output of the D/A conversion part 21 varies in voltage on the basis of the potential at the center-tap terminal 24; hereinafter, this potential will be called a reference voltage $V_{REF}$. The reference voltage $V_{REF}$ is used as the reference, based on which the amplifier circuit 23 operates.

In the conventional circuitry for the resistance-string-type D/A converter, the reference voltage $V_{REF}$ is obtained as one fraction of the total voltage across the resistance string according to the principle of the resistance-type potential divider. For this reason, the reference voltage $V_{REF}$ may vary in response to the variation of the power-supply voltage. Thus, the output voltage should also vary. In addition, the reference voltage $V_{REF}$ is produced inside of the D/A converter circuit. This raises a problem that when the amplifier circuit 23 is designed to operate with another reference voltage, it is difficult to perform a signal transmission between the D/A conversion part and amplifier circuit. For the same reason, when combining multiple D/A converters, multiple reference voltages should be produced. This raises a problem that the desired system cannot be configured using the multiple D/A converters conventionally known.

SUMMARY OF THE INVENTION

It is an object of the present invention to provide a digital-to-analog converter circuit in which the reference voltage can be stabilized, regardless of the variation of the power-supply voltage.

A digital-to-analog converter circuit mainly comprises a D/A conversion part, an operational amplifier and a reference-voltage producing circuit. The D/A conversion part is configured by a resistance string, consisting of a string of resistors connected in series, and a plurality of switches which are each turned on or off in response to a digital input. The reference-voltage producing circuit produces the reference voltage, the level of which is stabilized and is not affected by the power-supply voltage. The operational amplifier has two inputs, wherein a noninverting input receives the reference voltage, while an inverting input is connected to a center-tap terminal of the resistance string. An output terminal of the operational amplifier is connected to a positive-power-supply terminal of the D/A conversion part. Because of the characteristic of the operational amplifier, the reference voltage is applied to the center-tap terminal of the resistance string, so that an analog output of the D/A conversion part varies up and down with respect to the reference voltage.

Further, the output of the D/A conversion part can be supplied to an amplifier circuit, which operates based on the reference voltage, through a voltage follower.

BRIEF DESCRIPTION OF THE DRAWINGS

Further objects and advantages of the present invention will be apparent from the following description, reference being had to the accompanying drawings wherein the preferred embodiment of the present Invention is clearly shown.

In the drawings.

DESCRIPTION OF THE PREFERRED EMBODIMENT

Now, the preferred embodiment of the present invention will be described with reference to the drawings.

Figure 1:
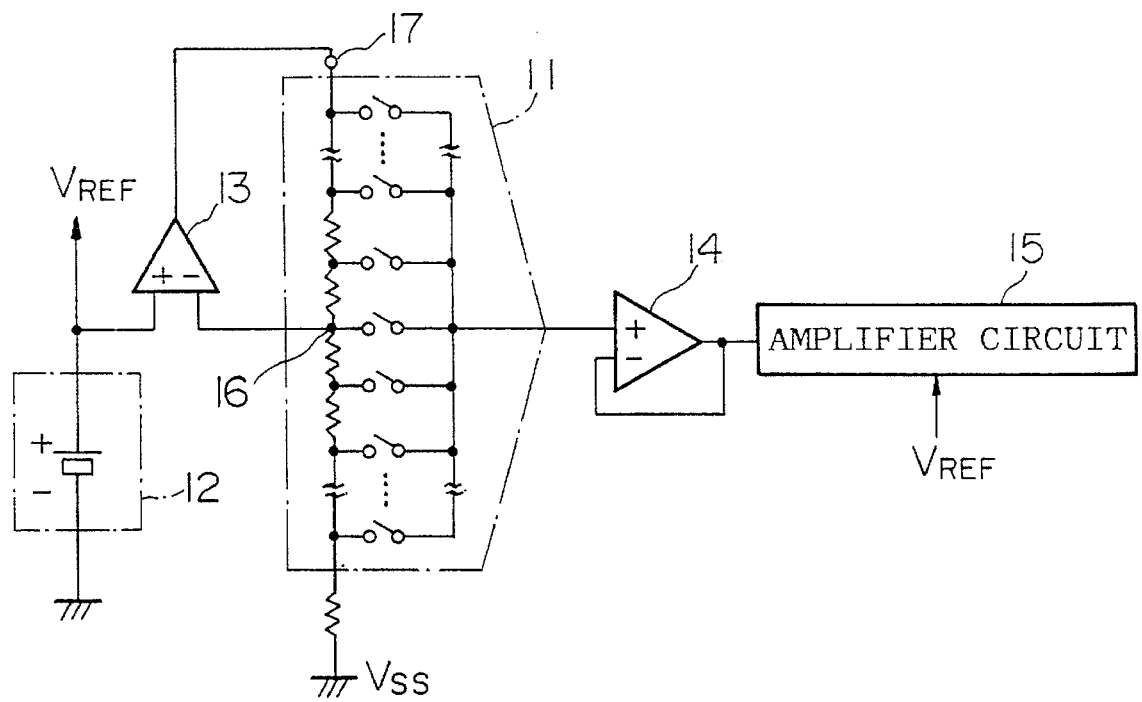
FIG. 1 is a block diagram showing an electric configuration for a D/A converter circuit according to an embodiment of the present invention.

FIG. 1 shows a D/A converter circuit according to an embodiment of the present invention. A main part 11 of the D/A converter (hereinafter, simply referred to as a D/A conversion part 11) comprises a string of resistors and CMOS switches. As compared to the conventional circuit, the present invention is characterized by providing a reference-voltage producing circuit 12, independently of the D/A conversion part 11. The reference-voltage producing circuit 12 produces a stabilized reference voltage $V_{REF}$, the level of which is determined directly by the bandgap of the semiconductor or the level of which is not affected by the variation of the power-supply voltage by utilizing the zener voltage.

An operational amplifier 13 serves as a power-supply circuit for the D/A conversion part 11 as well as a circuit for setting the reference voltage $V_{REF}$ at a center-tap terminal 16 of the resistance string. The operational amplifier 13 has two inputs. An output terminal of the reference-voltage producing circuit 12 is connected with a noninverting input (+) of the operational amplifier 13, so that the noninverting input receives the reference voltage. The other terminal of the reference-voltage producing circuit 12 is grounded. An inverting input (−) of the operational amplifier 13 is connected to the center-tap terminal 16 of the resistance string. An output terminal of the operational amplifier 13 is connected to a positive-power-supply terminal 17 office D/A conversion part 11.

The output of the D/A conversion part 11 is supplied to an amplifier circuit 15 through an operational amplifier 14 that is configured as a voltage follower. The reference voltage $V_{REF}$ produced by the reference-voltage producing circuit 12 is also supplied to the amplifier circuit 15, and the amplifier circuit operates based on this reference voltage.

In the circuit of FIG. 1, current output from the operational amplifier 13 flows through the resistance string of the D/A conversion part 11. Because the inverting input of the operational amplifier 13 is connected to the center-tap terminal 16 of the resistance string and the output terminal of the operational amplifier is connected with an edge terminal of the resistance string, half of the resisters in the resistance string (i.e., those located above the center-tap terminal 16 in FIG. 1) are used as feedback resisters for the operational amplifier. One of the characteristics of an operational amplifier is that the voltage between the two input terminals thereof is approximately zero. In other words, the voltage at the noninverting input terminal of an operational amplifier is approximately equal to the voltage at the inverting input terminal. In the circuit of FIG. 1, the voltage at the noninverting input (+) of the operational amplifier 13 is the reference voltage $V_{REF}$. Therefore, according to the properties of an operational amplifier, the voltage at the inverting input (−) of the operational amplifier 13 also equals the reference voltage $V_{REF}$. Because the inverting input is connected to the center-tap terminal 16 of the resistance string, the voltage at the center-tap terminal 16 of the resistance string of the D/A conversion part 11 is also equal to the reference voltage produced by the reference-voltage producing circuit 12 (i.e., the reference voltage $V_{REF}$ is applied to the center-tap terminal 16 of the resistance string). As a result, an analog output of the D/A conversion part 11 varies up and down with respect to the reference voltage $V_{REF}$. The reference-voltage producing circuit 12 and the operational amplifier 13 are provided independently of the D/A conversion part 11, so that they serve as the circuit for supplying the power-supply voltage to the D/A conversion part 11 as well as the circuit for setting the center of the output voltage of the D/A conversion part 11 to be identical to the reference voltage $V_{REF}$. Since the reference voltage $V_{REF}$ is stabilized as described before, the center of the output voltage of the D/A converter does not vary in response to the variation of the power-supply voltage. In other words, the output voltage of the D/A converter can be stabilized. This is a technical advantage of the present invention as compared to the conventional circuit. In addition, the amplifier circuit 15, which is connected with the D/A conversion part 11, also uses the stabilized reference voltage $V_{REF}$, which is equal to the center of the output voltage of the D/A conversion part 11. Thus, unlike the conventional circuit, the present invention does not provide a difficulty in the signal transmission between the D/A converter and the amplifier circuit.

Figure 2:
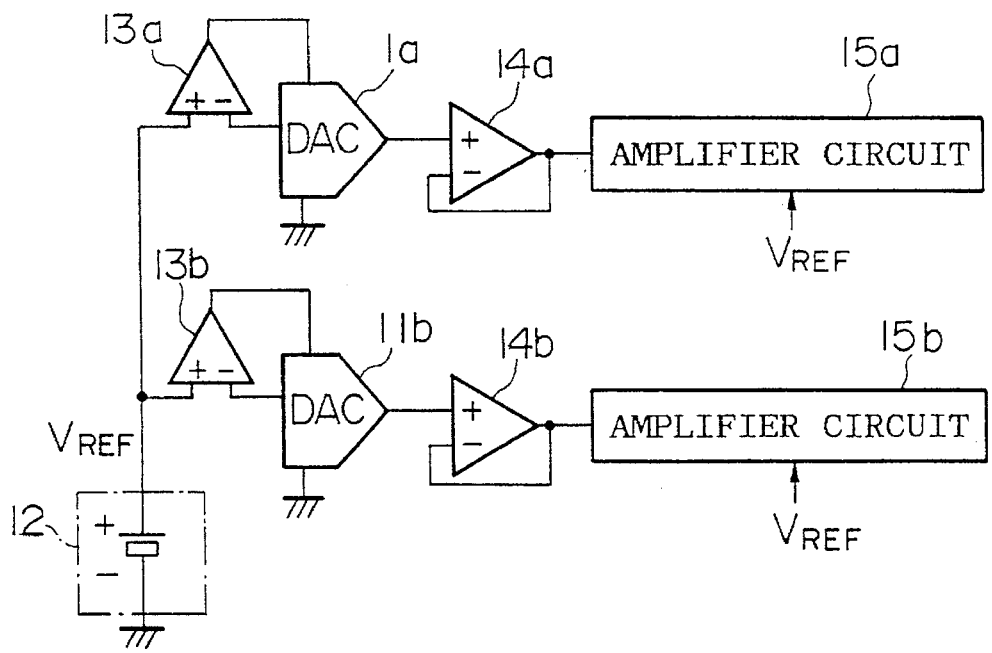
FIG. 2 is a block diagram showing a D/A conversion system which comprises multiple D/A converter circuits according to the embodiment of the present invention.
Figure 3:
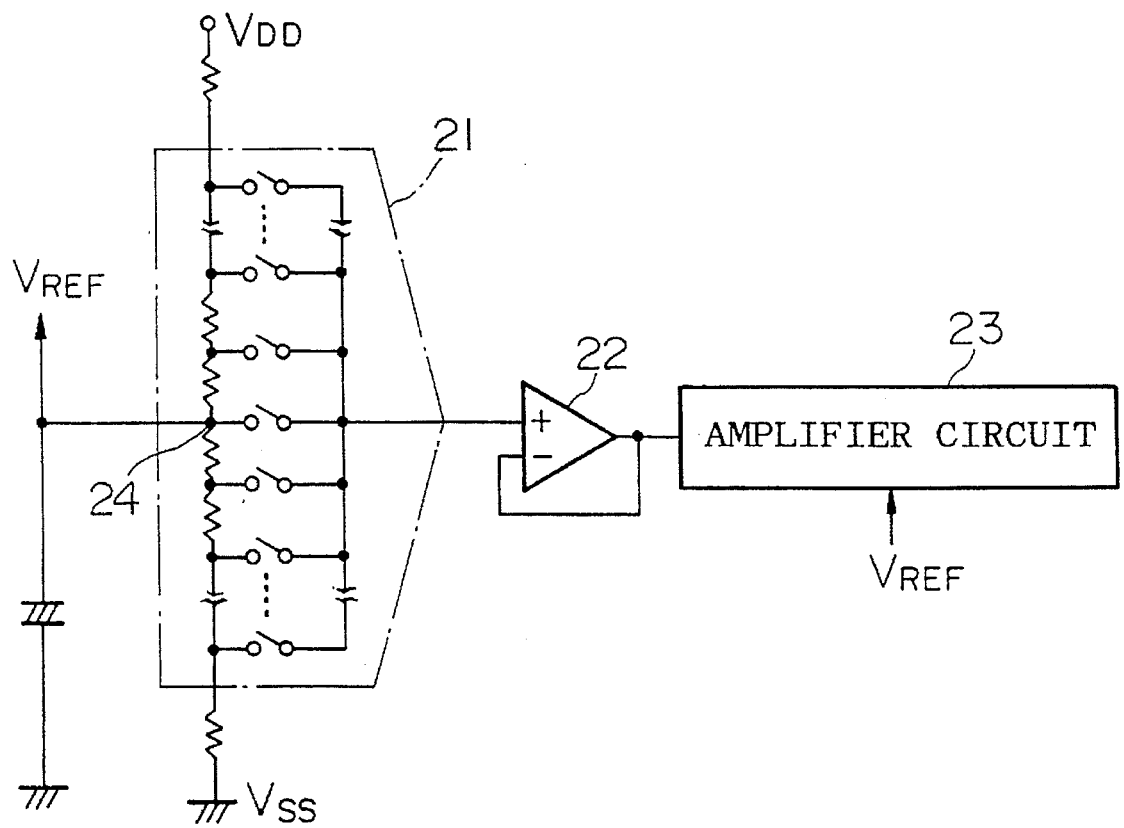
FIG. 3 is a block diagram showing the circuitry for the conventional resistance-string-type D/A converter.

FIG. 2 shows a D/A conversion system which comprises two D/A converter circuits according to the present embodiment. There are provided two D/A conversion parts 11a and 11b. The outputs of the D/A conversion parts 11a and 11b are respectively supplied to amplifier circuits 15a and 15b through voltage followers 14a and 14b.

A single reference-voltage producing circuit 12 is provided for both of the two D/A conversion parts 11a and 11b. As described before, the reference-voltage producing portion 12 is designed to produce the reference voltage $V_{REF}$, the level of which is stabilized. Further, there are provided two operational amplifiers 13a and 13b which respectively serve as circuits for supplying the power-supply voltages to the D/A conversion parts 11a and 11b as well as circuits for setting the centers of the output voltages of the D/A conversion parts 11a and 11b to be identical to the reference voltage $V_{REF}$. The reference voltage $V_{REF}$, which is produced by the reference-voltage producing circuit 12, is supplied commonly to the noninverting inputs of the operational amplifiers 13a and 13b. The same reference voltage $V_{REF}$ is also supplied to both of the amplifier circuits 15a and 15b.

In the D/A conversion system shown in FIG. 2, the stabilization in the operation of each D/A converter circuit is secured. Since the single reference-voltage producing circuit 12 is employed as the common source to produce the reference voltage $V_{REF}$ for the multiple D/A converter circuits as well as for the multiple amplifier circuits. Hence, it is possible to combine the D/A converter circuits together with ease and without causing any difficulty in the signal transmission between the D/A converter circuit and amplifier circuit.

Lastly, this invention may be practiced or embodied in still other ways without departing from the spirit or essential character thereof as described heretofore. Therefore, the preferred embodiment described herein is illustrative and not restrictive, the scope of the invention being indicated by the appended claims and all variations which come within the meaning of the claims are intended to be embraced therein.

What is claimed is:

1. A digital-to-analog converter circuit comprising:

digital-to-analog converter means, which comprises a resistance string, consisting of a string of resistors connected in series, and a plurality of switches, for converting a digital input to an analog output;

reference-voltage producing means for producing a reference voltage whose level is not affected by a power-supply voltage; and operational amplifier means having an inverting input and a noninverting input, wherein an output terminal of the reference-voltage producing means is connected with the noninverting input, while a center-tap terminal of the resistance string is connected with the inverting input, and an output terminal of the operational amplifier means is connected with a positive-power-supply terminal of the digital-to-analog converter means.

2. A digital-to-analog converter circuit comprising:

digital-to-analog converter means, which comprises a resistance string having a string of resistors connected in series and a plurality of switches, for converting a digital input into an analog output whose level varies up and down from a center potential;

amplifier means for amplifying the analog output of the digital-to-analog converter means;

reference-voltage producing means for producing a reference-voltage whose level is not affected by a power-supply voltage, the reference voltage being used as the center potential of the digital-to-analog converter means and also being used for the amplifier means; and an operational amplifier, wherein a noninverting input of the operational amplifier receives the reference voltage produced by the reference-voltage producing means, an inverting input of the operational amplifier is connected to a center-tap terminal of the resistance string, and an output terminal of the operational amplifier is connected to the resistance string such that half of the resistors provided in the resistance string are used as feedback resistors for the operational amplifier.

3. The digital-to-analog converter circuit as defined in claim 2, further comprising a voltage follower connected between the amplifier means and the digital-to-analog converter means.

4. The digital-to-analog converter circuit as defined in claim 2, further comprising a voltage follower for receiving the analog output of the digital-to-analog converter means, the voltage follower supplying its output to the amplifier means.

* * * * *